United States Patent
Reja et al.

(10) Patent No.: US 10,979,036 B1
(45) Date of Patent: Apr. 13, 2021

(54) DIVIDER CIRCUIT

(71) Applicant: Dialog Semiconductor B.V., 's-Hertogenbosch (NL)

(72) Inventors: Mahbub Reja, Chandler, AZ (US); Shobak Kythakyapuzha, Tempe, AZ (US); Jan Prummel, Eindhoven (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/456,298

(22) Filed: Jun. 28, 2019

(51) Int. Cl.
| | |
|---|---|
| *H03K 3/017* | (2006.01) |
| *H03K 3/037* | (2006.01) |
| *H03K 3/012* | (2006.01) |
| *H04B 1/10* | (2006.01) |
| *H03K 5/00* | (2006.01) |
| *H04B 1/401* | (2015.01) |
| *H04B 1/44* | (2006.01) |

(52) U.S. Cl.
CPC ......... *H03K 5/00006* (2013.01); *H03K 3/017* (2013.01); *H03K 3/037* (2013.01); *H04B 1/401* (2013.01); *H04B 1/44* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,216,295 | A * | 6/1993 | Hoang | H03K 3/356043 326/115 |
| 7,671,641 | B1 * | 3/2010 | Acar | H03K 23/44 327/115 |
| 7,737,738 | B2 * | 6/2010 | Acar | H03K 3/356017 327/115 |
| 9,379,722 | B2 * | 6/2016 | Chen | H03L 7/18 |

OTHER PUBLICATIONS

"A Power-Efficient 33 GHz 2:1 Static Frequency Divider in 0.12-μm SOI CMOS," by Jean-Olivier Plouchart et al., IEEE Radio Frequency Integrated Circuits Symposium, Jun. 9-10, 2003, pp. 329-332.

(Continued)

*Primary Examiner* — An T Luu
(74) *Attorney, Agent, or Firm* — Saile Ackerman LLC; Stephen B. Ackerman

(57) ABSTRACT

A frequency divider is provided which uses common circuitry to switch between different duty cycle outputs. The divider has one or more memory elements with a feedback loop and which are controllable to adjust a duty cycle of an output signal. Each memory element has a first regenerative cell and a second regenerative cell, and where one of the regenerative cells is a controllable regenerative cell which can be controlled to vary the duty cycle of an output of the frequency divider circuit. The controllable regenerative cell can be selectively activated so that in a first configuration where the controllable regenerative cell is activated an output of the frequency divider circuit has a first duty cycle and in a second configuration where the controllable regenerative cell is deactivated an output of the frequency divider circuit has a second duty cycle.

10 Claims, 10 Drawing Sheets

(56) References Cited

OTHER PUBLICATIONS

"25GHz Static Frequency Divider and 25Gb/s Multiplexer in 0.12μm CMOS," by Herbert Knapp et al., 2002 IEEE Solid-State Circuits Conference, ISSCC 2002 / Session17 / Advanced RF Techniques / 17.9, Feb. 2002, 3 pages.
"A 480μw 2GHz Ultra Low Power Dual-Modulus Prescaler in 0.25μm Standard CMOS," ISCAS 200—IEEE International Symposium on Circuits and Systems, May 28-31, 2000, Geneva, Switzerland, pp. V-741 to V-744.
"A 40 GHz Frequency Divider in 0.18-μm CMOS Technology," by Jri Lee et al., 2003 Symposium on VLSO Circuits Digest of Technical Papers, Jun. 2003, pp. 259-262.
"Transient Analysis of Regenerative Frequency Dividers," by Carl W. Helstrom, IEEE Transactions on Circuit Theory, vol. CT-12, No. 4, Dec. 1965, pp. 489-497.
"A 1.8V 3mW 16.8GHz Frequency Divider in 0.25μm CMOS," by Hongmo Wang, 2000 IEEE International Solid-State Circuits Conference, Jan. 2000, 2 pages.
TP 12.7 "A 79GHz Dynamic Frequency Divider in SiGe Bipolar Technology," by Herbert Knapp et al., 2000 IEEE International Solid-State Circuits Conference, Digest of Technical Papers, Feb. 2000, 2 pages.
"A 13.4-GHz CMOS Frequency Divider," by Behzad Razavi et al., Proceedings of IEEE International Solid-State Circuits Conference—ISSCC Sesion 10 / Optical Communication / Paper TP 10.5, Feb. 16-18, 1994, 2 pages.
"Design of High-Speed, Low-Power Frequency Dividers and Phase-Locked Loops in Deep Submicron CMOS," by Behad Razavi et al., IEEE Journal of Solid-State Circuits, vol. 30, No. 2, Feb. 1995, pp. 101-109.
"Design of Ultrahigh-Speed Low-Voltage CMOS CML Buffers and Latches," by Payam Heydari et al., IEEE Transactions on Very Large Scale Integration (VLSI) Systems, vol. 12, No. 10, Oct. 2004, pp. 1081-1093.
"18GHz low-power CMOS static frequency divider," by Z. Gu et al., Electronics Letters, vol. 39, No. 20, Oct. 2, 2003, 2 pages.
"High-Speed CMOS Circuit Technique," by Jiren Yuan et al., IEEE Journal of Solid-State Circuits, vol. 24, No. 1, Feb. 1989, pp. 62-70.
"Analysis and Optimization of Direct-Conversion Receivers With 25% Duty-Cycle Current-Driven Passive Mixers," by Ahmad Mirzaei et al., IEEE Transactions on Circuits and Systems—I: Regular Papers, vol. 57, No. 9, Sep. 2010, pp. 2353-2366.
"A Passive Mixer-First Receiver With Digitally Controlled and Widely Tunable RF Interface," by Caroline Andrews et al., IEEE Journal of Solid-State Circuits, vol. 45, No. 12, Dec. 2010, pp. 2696-2708.
A Circuit for All Seasons, "The Cross-Coupled Pair—Part 1," by Behzad Razavi, IEEE Solid-State Circuits Magazine, Summer 2014, pp. 7-10.
"Design of Low-Voltage Wide Tuning Range CMOS Multipass Voltage-Controlled Ring Oscillator," by Jie Ren et al., 2010 53rd IEEE International Midwest Symposium on Circuits and Systems, Aug. 1-4, 2010, pp. 109-112.
MIT Open Courseware, "High Speed Communication Circuits and Systems," Lecture 14, High Speed Frequency Dividers, by Michael Perrott, © 2003, 23 pages.
"A 1.9nJ/b 2.4GHz Multistandard (Bluetooth Low Energy/Zigbee/IEEE802.15.6) Transceiver for Personal/Body-Area Networks," by You-Hong Liu et al., 2013 IEEE International Solid-State Circuits Conference,Digest of Technical Papers, Feb. 17-21, 2013, pp. 446-448.
"Design of a Low-Power Low-Phase-Noise Multi-Mode Divider With 25%-Duty-Cycle Outputs in 0.13μm CMOS," by Song Hu et al., 2011 9th IEEE International Conference on ASIC, Oct. 25-28, 2011, 4 pages.

* cited by examiner

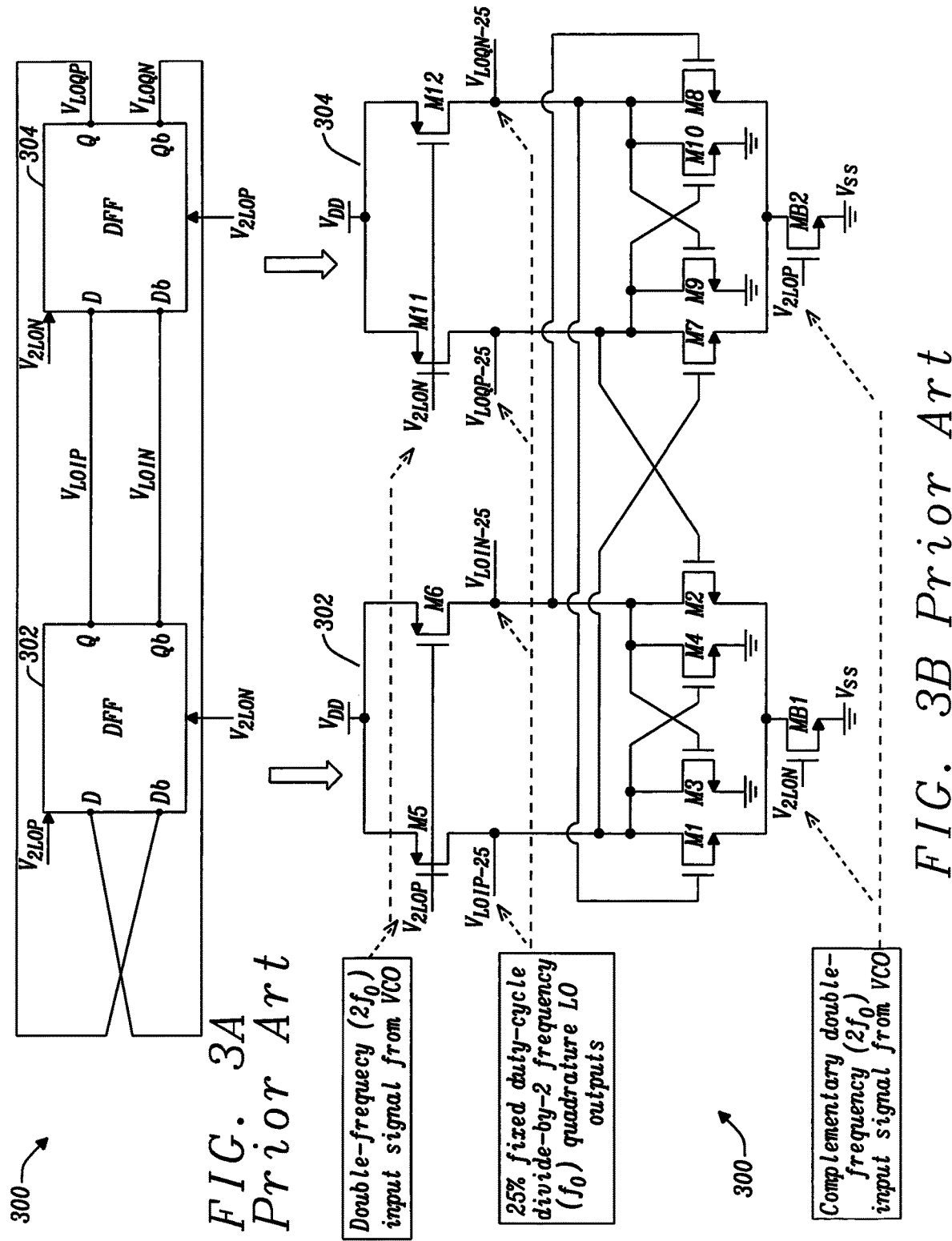

DIVIDER CIRCUIT

TECHNICAL FIELD

The present disclosure relates to a divider circuit, to a radio-frequency (RF) transceiver incorporating a divider circuit and to methods of signal processing.

BACKGROUND

Frequency conversion is an essential function in a receiver (down-conversion) and transmitter (up-conversion) of a transceiver to convert RF signals to intermediate-frequency (IF) or baseband (BB) signals and vice versa using local-oscillator (LO) signals.

In modern communications, employing digital modulation or demodulation schemes (GFSK, QPSK, QAM), quadrature (900 phase shifted) LO signals (0°, 1800 and 90°, 270° phases) are used for frequency conversion in achieving efficient transmission and reliable reception of data. LO signals may be obtained from a voltage-controlled oscillator (VCO) or digitally controlled oscillator (DCO) of a frequency synthesizer in a radio transceiver.

Low silicon-die area and low power RF and analog circuits are crucial requirements to implement a compact (low die area i.e. low cost) radio transceiver operating with long battery life.

For compact and low power radio transceivers such as Bluetooth low energy (BLE) or Zigbee radios, it is known to use digital RF transmitters comprising high-efficiency switch-mode power-amplifiers such as Class D, Class E or Class F amplifiers. A switch-mode power amplifier (PA) is driven by rail-to-rail RF clock signals (modulated or unmodulated) and can theoretically have no overlap between voltage and current signals in the PA output stage resulting in no power loss or heat dissipation leading to theoretical 100% efficiency. However, in practice device (and connectivity) parasitics in the PA output stage limits practical efficiency, typically to between 60% and 70%.

In practical implementations and applications, typically, frequency dividers generate divided-frequency LO signals ($f_0$) from double-frequency ($2f_0$) VCO or DCO signals to avoid frequency pulling.

Theoretically, switch-mode PAs, driven by 50% duty-cycle rectangular RF signals even-symmetry), generate no even harmonics ($2f_0$, $4f_0$, ... ) of a desired signal (f0). Therefore, digital RF transmitters with switch-mode power amplification and using 50% duty-cycle LO signals ($f_0$) have an added advantage of suppressed unwanted even harmonics ($2f_0$, $4f_0$, ... ) along with efficient power transmission of a wanted signal ($f_0$).

A receiver can also use 50% duty-cycle LO signals to reduce intermodulation distortion and so to increase receiver (Rx) linearity. This feature can be used in receiver automatic-gain-control (AGC) mode for trading off receiver sensitivity with linearity.

On the other hand, for higher sensitivity, RF receivers can use 25% duty-cycle (non-overlapped) LO signals ($f_0$) to obtain a higher conversion gain and a lower noise-figure (NF).

Frequency divider circuits have a fixed duty cycle, so if a system is to benefit from both suppression of unwanted even harmonics and from higher sensitivity, then two different frequency divider circuits have to be implemented so that both the 25% and 50% duty cycles can be provided. Furthermore, additional frequency divider circuits are also required if any other duty cycles are needed.

SUMMARY

According to a first aspect of the disclosure there is provided a divider circuit comprising one or more memory elements with a feedback loop and which are controllable to adjust a duty cycle of an output signal.

Optionally, the or each memory element comprises a first regenerative cell and a second regenerative cell, and where one of said regenerative cells is a controllable regenerative cell which can be controlled to vary the duty cycle of an output of the frequency divider circuit.

Optionally, said controllable regenerative cell can be selectively activated so that in a first configuration where the controllable regenerative cell is activated an output of the frequency divider circuit has a first duty cycle and in a second configuration where the controllable regenerative cell is deactivated an output of the frequency divider circuit has a second duty cycle.

Optionally, the first regenerative cell is a source regenerative cell and the second regenerative cell is a sink regenerative cell.

Optionally, the memory element comprises a variable current source coupled with said source regenerative cell and operable to control said source regenerative cell.

Optionally, the frequency divider circuit comprises a variable current source which is operable to tune the duty cycle of an output signal.

Optionally, the frequency divider circuit comprises an inverter between an output of a first slave memory element and an input of a master memory element.

Optionally, the or each memory element comprises a D-type flip flop.

According to a second aspect of the disclosure there is provided a transceiver comprising a frequency divider circuit comprising one or more memory elements with a feedback loop and which are controllable to adjust a duty cycle of an output signal.

According to a third aspect of the disclosure there is provided a mobile device comprising the transceiver of the second aspect.

According to a fourth aspect of the disclosure there is provided a frequency division method comprising providing one or more memory elements with a feedback loop and controlling said elements to adjust a duty cycle of an output signal.

BRIEF DESCRIPTION OF THE DRAWINGS

The disclosure is described in further detail below by way of example and with reference to the accompanying drawings, in which:

FIGS. 3A and 3B show another existing frequency divider, a basic schematic being shown in FIG. 3A and a more detailed version shown in FIG. 3B;

DESCRIPTION

Existing frequency dividers can generate only fixed duty-cycle LO signals, most commonly either 25% or 50% duty-cycles. Additional circuitry (involving logic gates (AND gates) and inverter buffers) is needed to generate a 25% duty-cycle LO signal from a 50% duty cycle LO signal and vice versa. This comes at the cost of increased current consumption and area, and causes functional complexity and inaccuracy in duty-cycle with additional power consumption.

In current state-of-the-art wireless transceivers, it is necessary to employ a number of separate frequency dividers to provide different duty cycle outputs. For example, it is common to use separate frequency dividers in transmit-mode (for 50% duty-cycle LO signal) and receive-mode (for 25% duty-cycle LO signal) operations. Two different frequency dividers have different loading effects on the VCO or (DCO) of a frequency synthesizer.

Separate dividers are also conventionally required for RX and TX because the quadrature relation is best if the division is done close to the PA and close to the Mixer, which can't be located close to each other.

Furthermore, additional circuit techniques are needed to mitigate unbalanced loading effects with additional power consumption—for example, different sized coupling capacitors must be provided to feed individual divider circuits.

Overall, two separate dividers for the receiver and transmitter of a transceiver require additional silicon die or chip area, which increases cost.

Different circuit configurations for frequency dividers include static, dynamic, injection locked and regenerative dividers. Typically, logic gates and latches (flip-flops) are used to implement frequency dividers. Injection locked frequency dividers employ an oscillator whose center frequency ($f_0$) is locked to a harmonic of the incoming VCO or DCO signal frequency ($2f_0$). The known dividers generate only fixed duty-cycle (25% or 50%) LO signals.

This disclosure provides a technique of generating two or more divided-frequency LO signals with different duty cycles using a single or common divider circuit. Such a divider circuit may be provided as part of receiver, a transmitter or a transceiver (where it may be part of both a receiver part and a transmitter part). The divided-frequency LO signals may in a preferred embodiment comprise a 25% duty-cycle frequency divided LO signal and a 50% duty-cycle frequency divided LO signal, although it will be appreciated that divided-frequency LO signals with other duty-cycles can be provided in alternative embodiments.

The use of single frequency divider instead of needing to use a plurality of frequency dividers leads to a lower silicon die area and therefore a lower cost structure and enables lower cost components such as radio transceivers for wireless communications.

Figure 1:
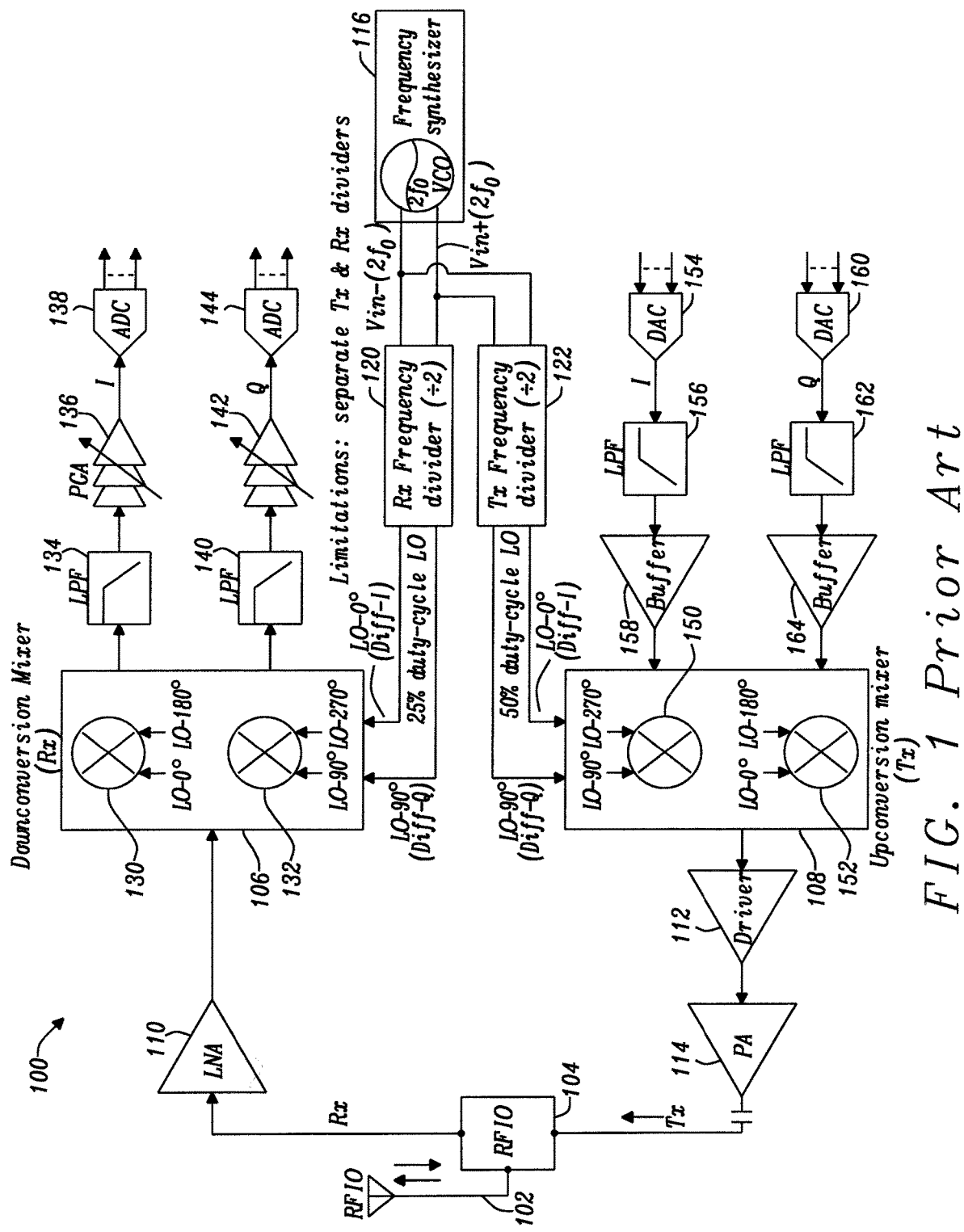
FIG. 1 shows a typical zero-IF or low-IF transceiver block diagram for short-range wireless communications or standards such as Bluetooth classic (BT), Bluetooth low-energy (BLE), Zigbee, or WLAN.

FIG. 1 is a simplified block diagram of a typical zero-IF or low-IF transceiver 100, which may be used for short-range wireless communications or standards such as Bluetooth classic (BT), Bluetooth low-energy (BLE), Zigbee or WLAN.

Antenna 102 receives and sends data, interfacing with radio frequency input/output (RFIO) block 104. Received signals are passed through a low noise amplifier (LNA) 110 and downconverted via downconversion mixer (Rx) 106, while signals to be transmitted are upconverted via upconversion mixer 108 and passed to the RFIO 104 via driver 112 and power amplifier 114. The RFIO 104 may control switching of the transceiver 100 between a receive mode and a transmit mode.

Frequency synthesizer 116, in this case a voltage-controlled oscillator (VCO), provides an output signal with frequency $2f_0$ which is input to a first divide by two frequency divider 120 and a second divide by two frequency divider 122.

The downconversion mixer 106 comprises an in-phase (I) mixer 130 and a quadrature (Q) mixer 132. The in-phase (I) mixer 130 provides in-phase signals to a BB (baseband) chain comprising a low pass filter LPF (134), and programmable gain amplifier 136, which is converted by an analog-to-digital converter (ADC) 138 for further processing. Similarly, the quadrature (Q) mixer 132 provides a quadrature component via baseband chain comprising low pass filter 140 and programmable gain amplifier 142, which is converted by an analog-to-digital converter (ADC) 144 for further processing.

Similarly, the upconversion mixer 108 comprises an in-phase (I) mixer 150 and a quadrature (Q) mixer 152. Data to be transmitted is converted via a digital-to-analog converter (DAC) 154 to provide an input for the in-phase mixer 150 via a baseband chain including low pass filter 156 and buffer 158, and is converted via a digital-to-analog converter (DAC) 160 to provide an input for the in-phase mixer 152 via a baseband chain including low pass filter 162 and buffer 164.

The first frequency divider 120 provides a 25% duty-cycle LO signal and is used in receive (Rx) mode. The 25% duty-cycle LO signals achieve higher receiver sensitivity with increased conversion gain (in mixer) and reduced noise-figure (3.0 dB lower than that of using 50% duty-cycle).

The second frequency divider 122 provides a 50% duty-cycle LO signal and is used in transmit (Tx) mode. The 50% duty-cycle LO signal is suppresses undesired even-harmonics ($2f_0$, $4f_0$, . . . ) of the desired transmitted signal ($f_0$).

As can be seen from this example, two separate frequency dividers (Rx frequency divider 120 and Tx frequency divider 122) must be used in the transceiver 100 because the dividers are limited to having a fixed duty cycle (here, either 25% or 50%).

Furthermore, different types of frequency dividers have different loading effects on the frequency synthesizer 116, whether it comprises a VCO or a DCO. Additional circuit techniques are needed to mitigate unbalanced loading effects, such as providing different sized VCO coupling capacitors for Tx and Rx dividers, or providing different coupling capacitors of different sizes to provide complementary Rx clock signals. These additional circuit techniques also require additional silicon die area and so result in increased cost.

Figures 2A, 2B:
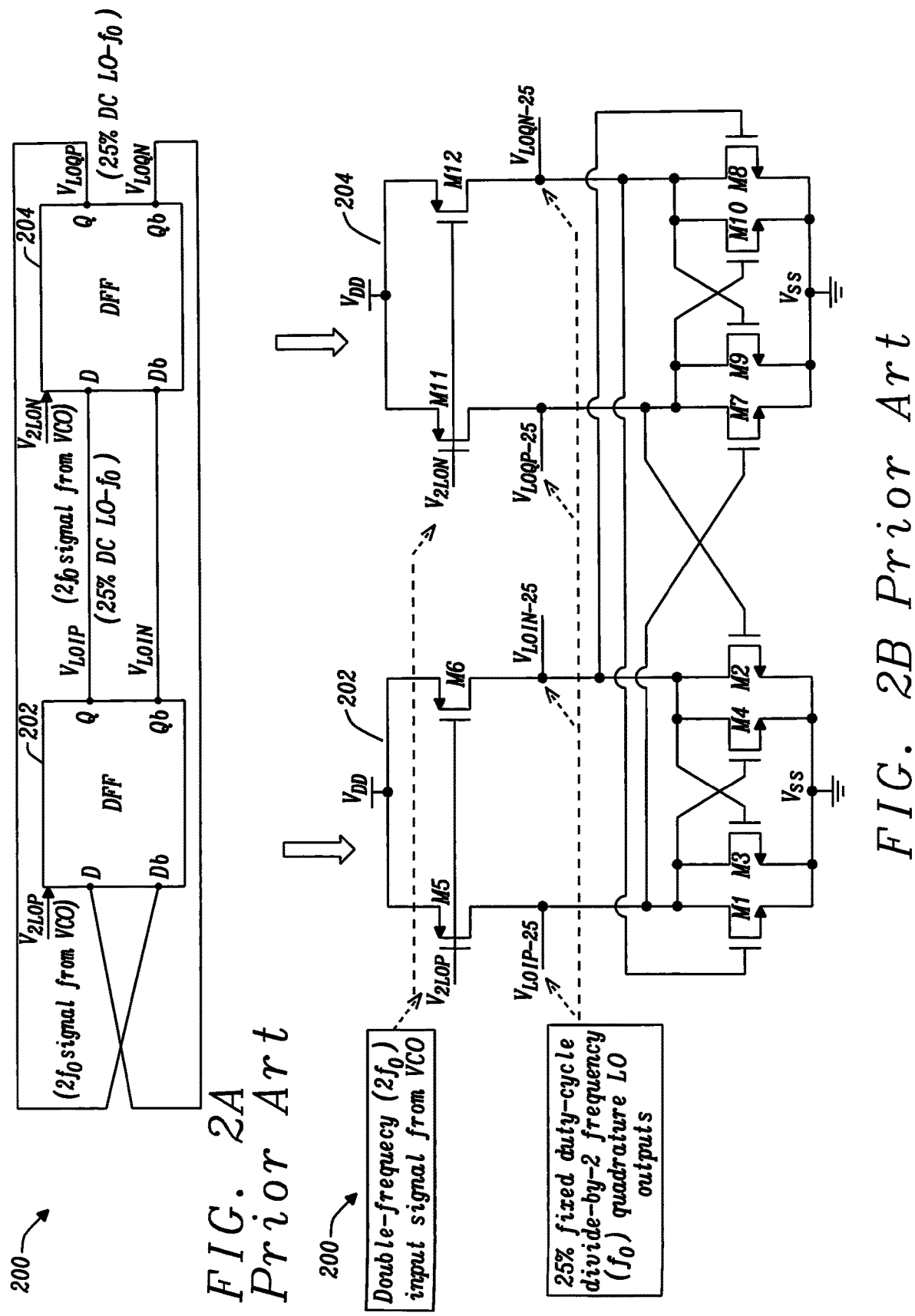
FIGS. 2A and 2B show an existing frequency divider, a basic schematic being shown in FIG. 2A and a more detailed version shown in FIG. 2B.

FIGS. 2A and 2B show an existing frequency divider 200, a basic schematic being shown in FIG. 2A and a more detailed version shown in FIG. 2B. The divider 200 comprises a first memory element 202 and a second memory element 204 which are connected in negative feedback. The memory elements 202, 204 may be latches such as D-type flip flops, DFF.

Each D-type flip flop 202 204 has two sense MOSFET devices (M1, M2 or M7, M8) two regenerative devices (M3, M4 or M9, M10) and two pull-up devices (M5, M6 or M11, M12). D-type flip-flops 202, 204 are triggered by complementary or 2-phase (0° and 180°) double-frequency ($2f_0$) clock ($V_{2LOP}$ & $V_{2LON}$) signals from the VCO of a frequency synthesizer. The divider 200 generates four phases (quadrature) (0°, 180°, & 90°, 270°) 25% fixed duty-cycle divided-frequency ($f_0$) LO signals ($V_{LOIP-25}$ $V_{LOIN-25}$, $V_{LOQP-25}$ and $V_{LOQN-25}$).

The operation of this divider is controlled by input PMOS devices. When the input clock is high, the left latch is in the sense mode and the right latch is in the store mode. When the clock goes low, these two latches exchange their states. When clock is high, M5 and M6 are off, M11 and M12 are on. The regenerative loop (M9 and M10) makes (Vloqp-25 and Vlogn-25) reverse (assume Vloqp-25 high). When clock goes low, M5, M6 are on, and M11 and M12 are off. A high Vloqp-25 turns M1 on, making Vloqn-25 low. This also forces Vloqp-25 high when a low Vloqn-25 turns M2 off. Meanwhile, high Vloqp-25 turns M7 on. Forcing Vloip-25 low and clock goes high again, with Vloin-25 high and other three nodes low. Then, Voqn-25 turns. At any time, only one of the four output is high while other three are low. As a result, quadrature 25%-duty cycle divide-by-2 LO signal is generated.

There are two requirements to make output high. One demand is that the corresponding pull-up PMOS devices is turned on. The other demand is that, the gate of the corresponding sense device connected to the output, whose voltage level is low at previous phase. Hence, the divide-by-2 operation produces inherent quadrature 25% duty-cycle outputs.

FIGS. 3A and 3B show another existing frequency divider 300 comprising to DFFs 302, 304 in negative feedback. A basic schematic is shown in FIG. 3A and a more detailed version shown in FIG. 3B. This divider 300 applies complementary double-frequency clocks ($V_{2LOP}$ and $V_{2LON}$) to each D-type flip-flop 302, 304 (obtained from a VCO). This divider 300 generates also 4-phases or quadrature (0°, 180°, 90°, 270°) 25% fixed duty-cycle divided frequency ($f_0$) LO signals from 2-phases (0° and 180°) double-frequency ($2f_0$) VCO signal.

Figures 4A, 4B:
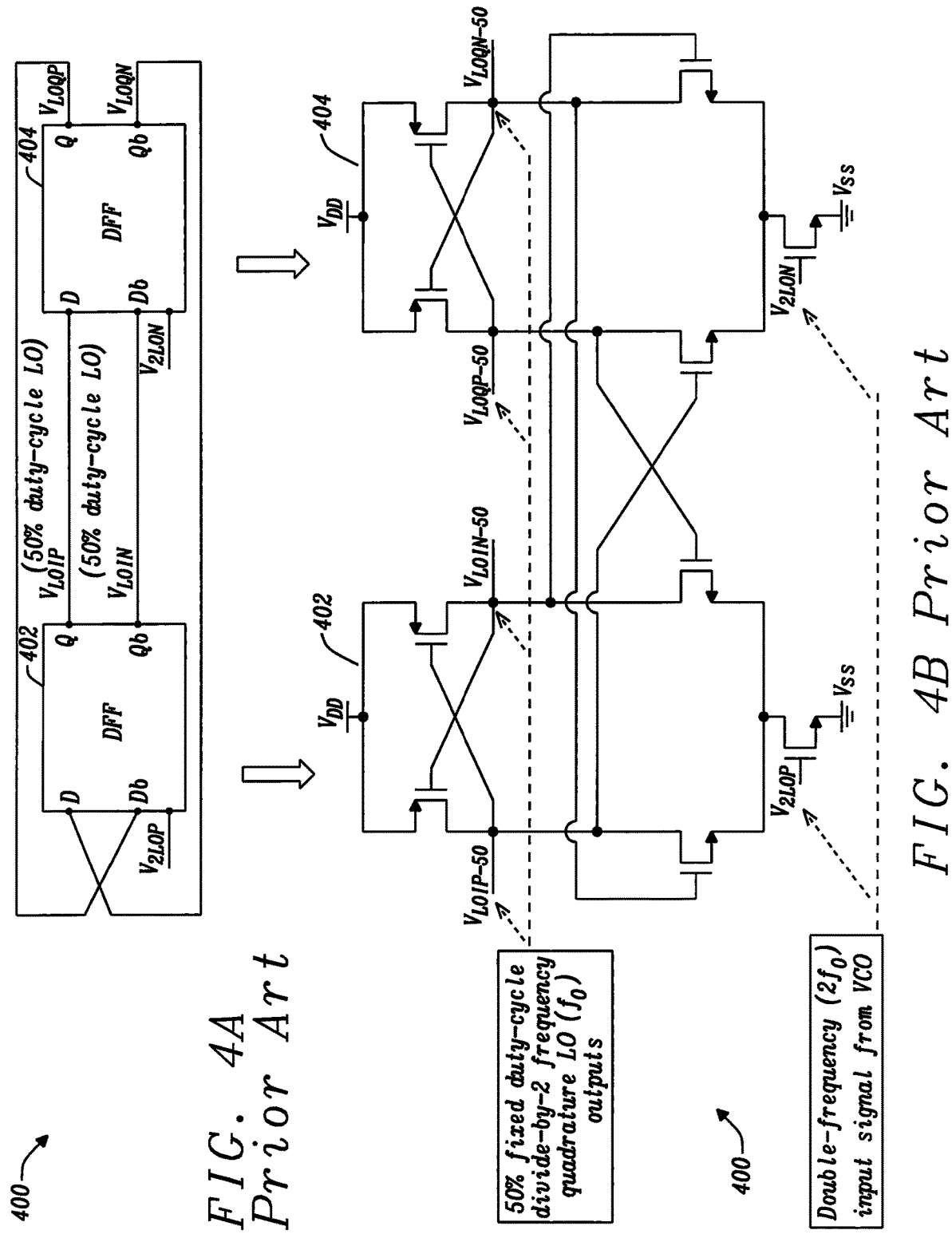
FIGS. 4A and 4B show a further existing frequency divider, a basic schematic being shown in FIG. 4A and a more detailed version shown in FIG. 4B.

FIGS. 4A and 4B show a further existing frequency divider 400 comprising to DFFs 402, 404 in negative feedback. A basic schematic is shown in FIG. 4A and a more detailed version shown in FIG. 4B. This divider 400 comprises two dynamic DFFs 402, 404 in master-slave configuration and can generate 4-phases or quadrature (0°, 180°, 90° and 270°) 50% fixed duty-cycle divided-frequency ($f_0$) LO signals ($f_{LOIP-50}$, $f_{LOIN-50}$, $f_{LOQP-50}$ and $f_{LOQN-50}$) from 2-phases (0° and 180°) double-frequency ($2f_0$) VCO or DCO signals.

Prior art dividers such as those shown above can only offer outputs of a fixed duty-cycle. In contrast, the present disclosure provides a frequency divider which can generate different duty-cycle outputs using the same frequency divider architecture.

Figure 5:
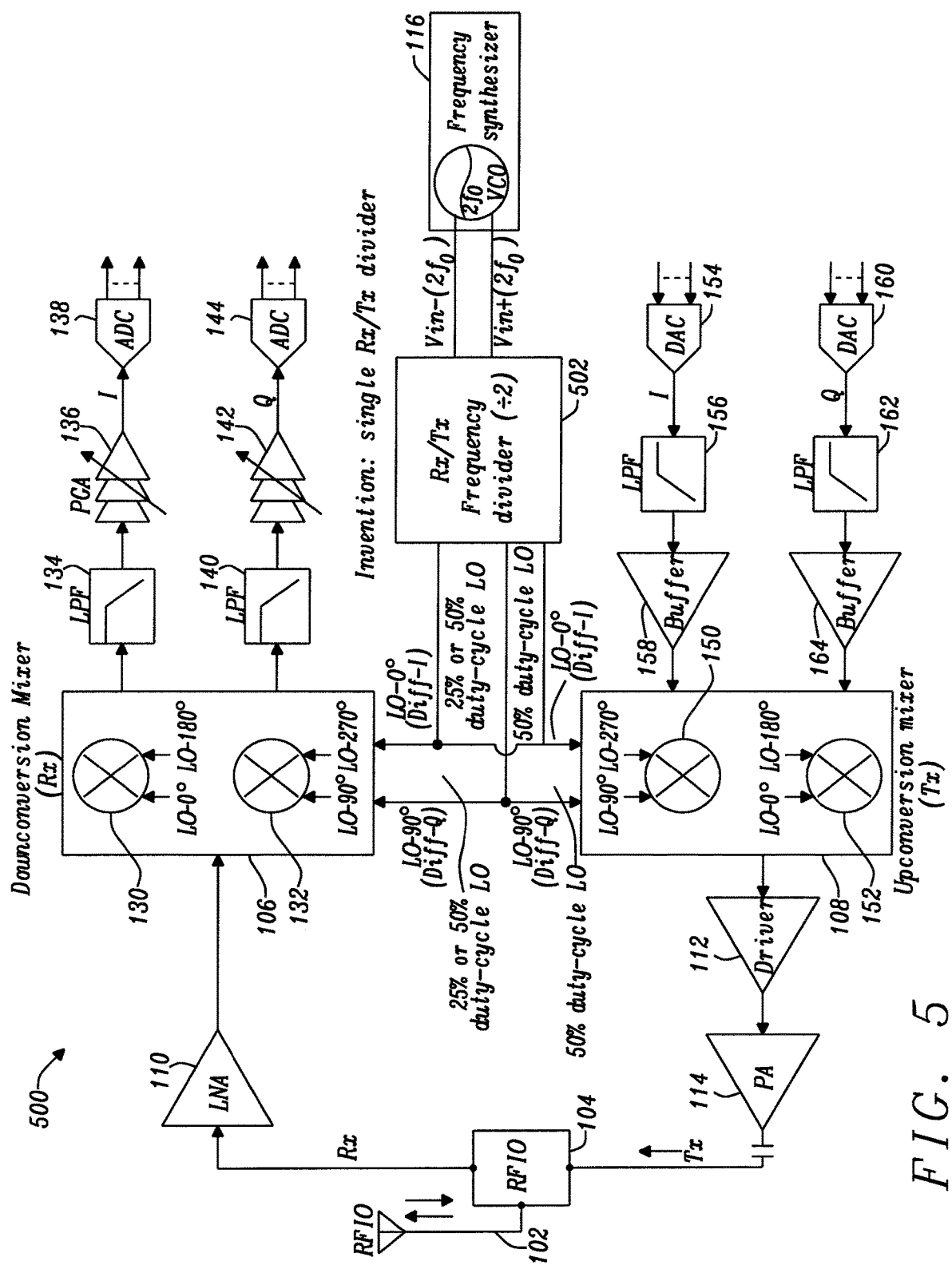
FIG. 5 shows an example of a transceiver incorporating a frequency divider according to the present disclosure.

FIG. 5 shows an example of a transceiver 500 incorporating a frequency divider 502 according to the present disclosure. It is to be appreciated that the components of the transceiver 500 are shown for illustration purposes are do not limit the scope of this disclosure. In this example, a frequency divider 502 according to the disclosure acts as a single common frequency divider, namely a Tx/Rx divider, being able to provide both receive (Rx) and transmit (Tx) outputs, at 25% duty cycle and 50% duty cycles respectively. The components of the transceiver 500 are illustrated with the same reference numerals as those in FIG. 1, and operate in the same way as described above.

As well as switching between duty cycles for Rx and Tx modes, the transceiver 500 can switch between different duty cycles in different modes. For example, in Rx mode the duty cycle can be varied based on a measured received signal strength indication (RSSI). This could be done dynamically during a Bluetooth packet preamble or measured and then configured for subsequent packets.

Figure 6A:
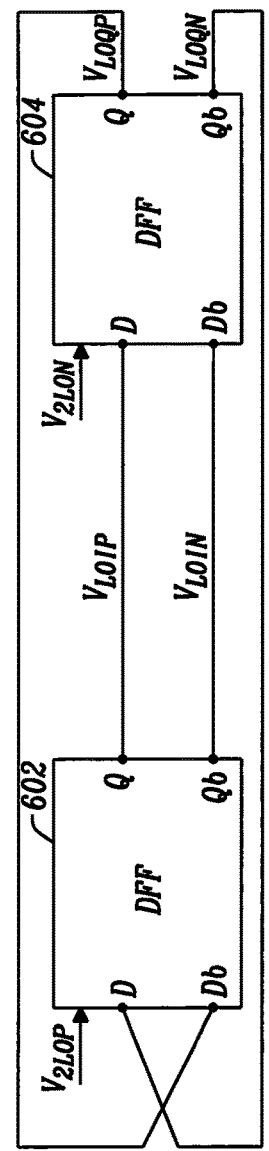
FIGS. 6A and 6B show an embodiment of a frequency divider circuit according to the disclosure, as can be used with the transceiver of FIG. 5 for example, with a basic schematic being shown in FIG. 6A and a more detailed version shown in FIG. 6B.
Figure 6B:
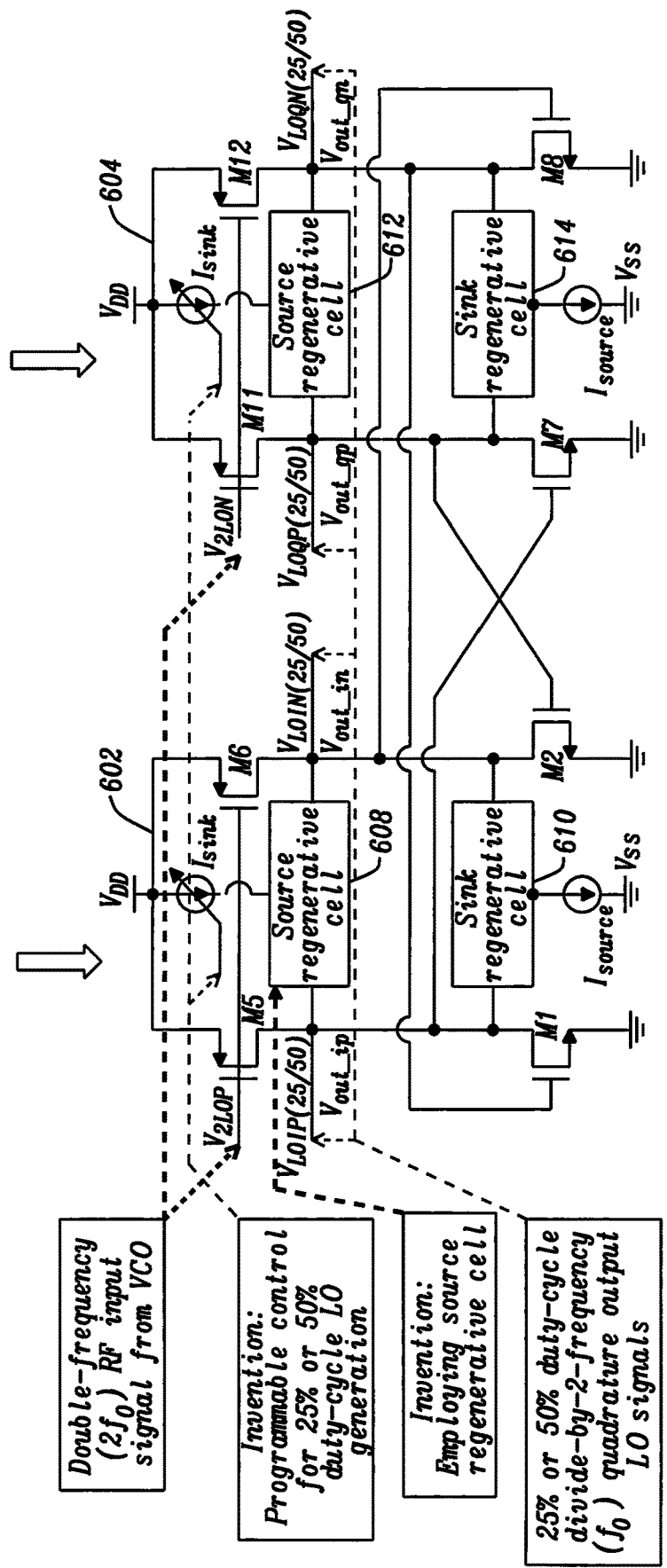

An embodiment of a frequency divider circuit 600 according to the disclosure is shown in FIGS. 6A and 6B, a basic schematic being shown in FIG. 6A and a more detailed version shown in FIG. 6B. The frequency divider circuit 600 comprises a first memory element 602 and a second memory element 604 which are connected in negative feedback. Each of the memory elements 602, 604 are suitably DFFs.

In a memory element, a regenerative cell is used to ensure that a stored logic state can persist when a clock signal is de-asserted. A normal memory element design has a single regenerative cell (also referred to as a "regenerative loop"), provided in FIGS. 2 through 4 by devices M3, M4 and M9, M10 in each of the DFFs 202, 204, 302, 304, 402, 404.

According to this embodiment, a memory element 602, 604 of a new frequency divider circuit 600 is provided with two regenerative cells (see references 608 and 610 for the memory element 602, and references 612, 614 for the memory element 604). The regenerative cells may also be referred to as "regenerative loops". In a preferred embodiment a memory element 602, 604 comprises a source regenerative cell 608, 612 and a sink regenerative cell 610, 614. The memory elements 602, 604 may suitably comprise D-type flip flops (DFFs) but may also comprise latches.

Double frequency ($2f_0$) 2-phases (0° & 180°) RF input signals ($V_{2LOP}$ and $V_{2LON}$) from a VCO are applied to the gates of PMOS devices (M5, M6 in master DFF 602 and M11, M12 in slave DFF 604).

Figure 7:
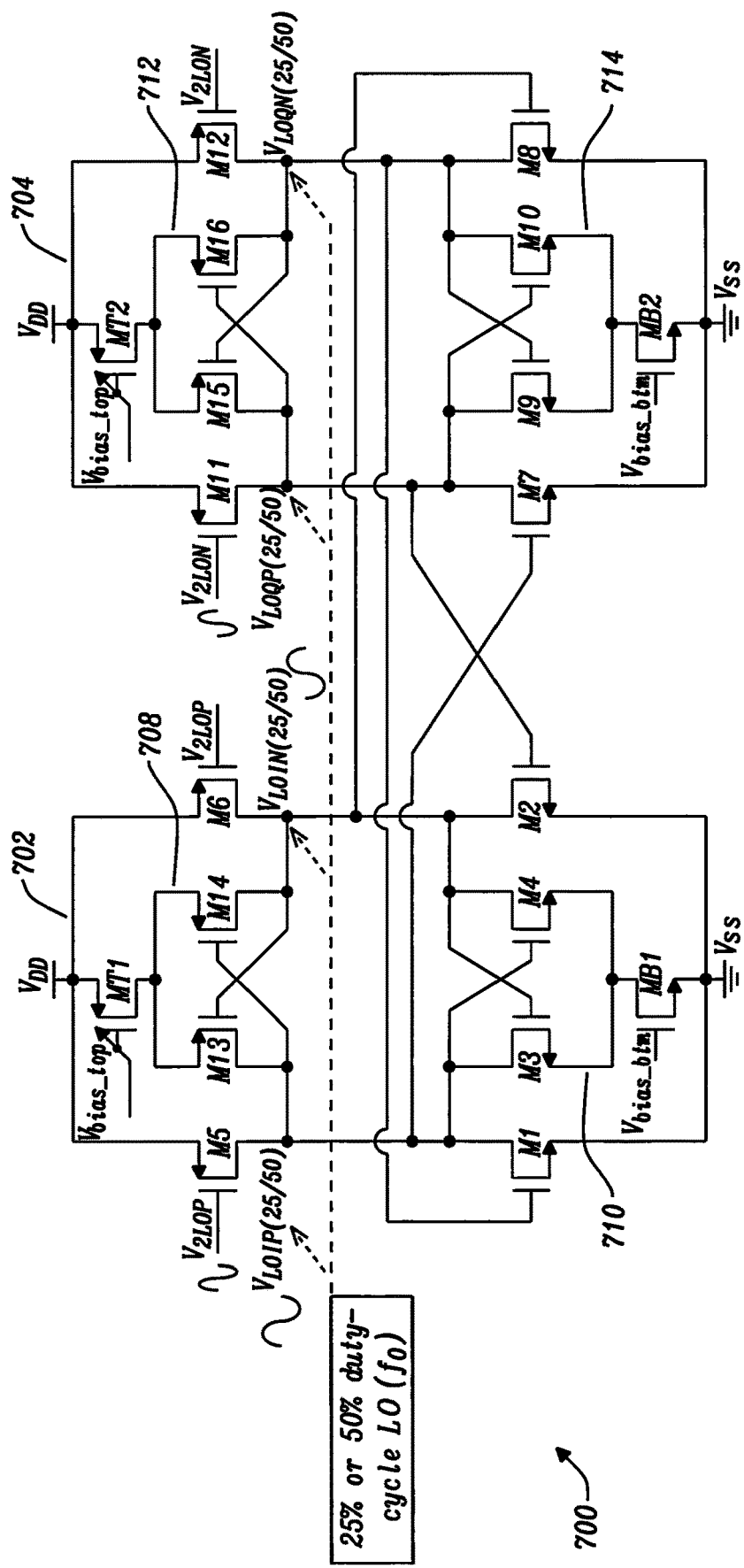
FIG. 7 shows details of a frequency divider according to another embodiment of the disclosure.

FIG. 7 shows details of a frequency divider circuit 700 according to another embodiment of the disclosure. This frequency divider circuit 700 also comprises a master DFF 702 with a source regenerative cell 708 and a sink regenerative cell 710 and slave DFF 704 with a source regenerative cell 712 and a sink regenerative cell 714. In this circuit, a sink current-source (the MOSFETs MT1, MT2 and variable bias voltage $V_{bias\_top}$ provide the sink current sources $I_{sink}$ of the previous figure) is provided for each sink regenerative cell or loop 710, 714. The source-regenerative loop 708 in the master DFF 702 (comprising devices M13 and M14) and the source-regenerative loop 712 in the slave DFF 704 (comprising devices M15 and M16), are controlled by a voltage-controlled source current source comprising MOSFET device, MT1 or MT2.

By applying a variable (or programmable) bias voltage, $V_{bias\_top}$, the current-source transistor MT1 or MT2 can be fully-biased (up to $V_{DD}$) and thus act as switch. The partial biasing of MT1 (or MT2) by a lower voltage (<$V_{DD}$) allows for varying the duty-cycle of the divided outputs. A bottom bias voltage, $V_{bias\_btm}$, can be used to turn on or off MOSFETs MB1 and MB2. The full bias voltage $V_{bias\_btm}$, (up to $V_{DD}$) makes MB1 and MB2 working as switches. The lower $V_{bias\_btm}$, (<$V_{DD}$) helps to adjust duty-cycle while operating in 50% duty-cycle divider mode.

Controlling (turning ON or OFF) the source-regenerative cells 708, 712 through a current-source (the MOSFETs MB1, MB2 and variable bias voltage $V_{bias\_btm}$ provide the source current source $I_{source}$ of the previous figure) allows for generating 25% or 50% duty-cycle divided frequency ($f_0$) quadrature LO signals. By turning off the source-regenerative loops or cells 708, 712 through current-source devices MT1 and MT2 (which are turned ON or OFF by $V_{bias\_top}$), the frequency divider circuit 700 is turned into a 25% duty-cycle divider generating 4-phases divided output LO signals ($V_{LOIP\text{-}25}$, $V_{LOIN\text{-}25}$, $V_{LOQP\text{-}25}$, $V_{LOQN\text{-}25}$).

Figure 8:
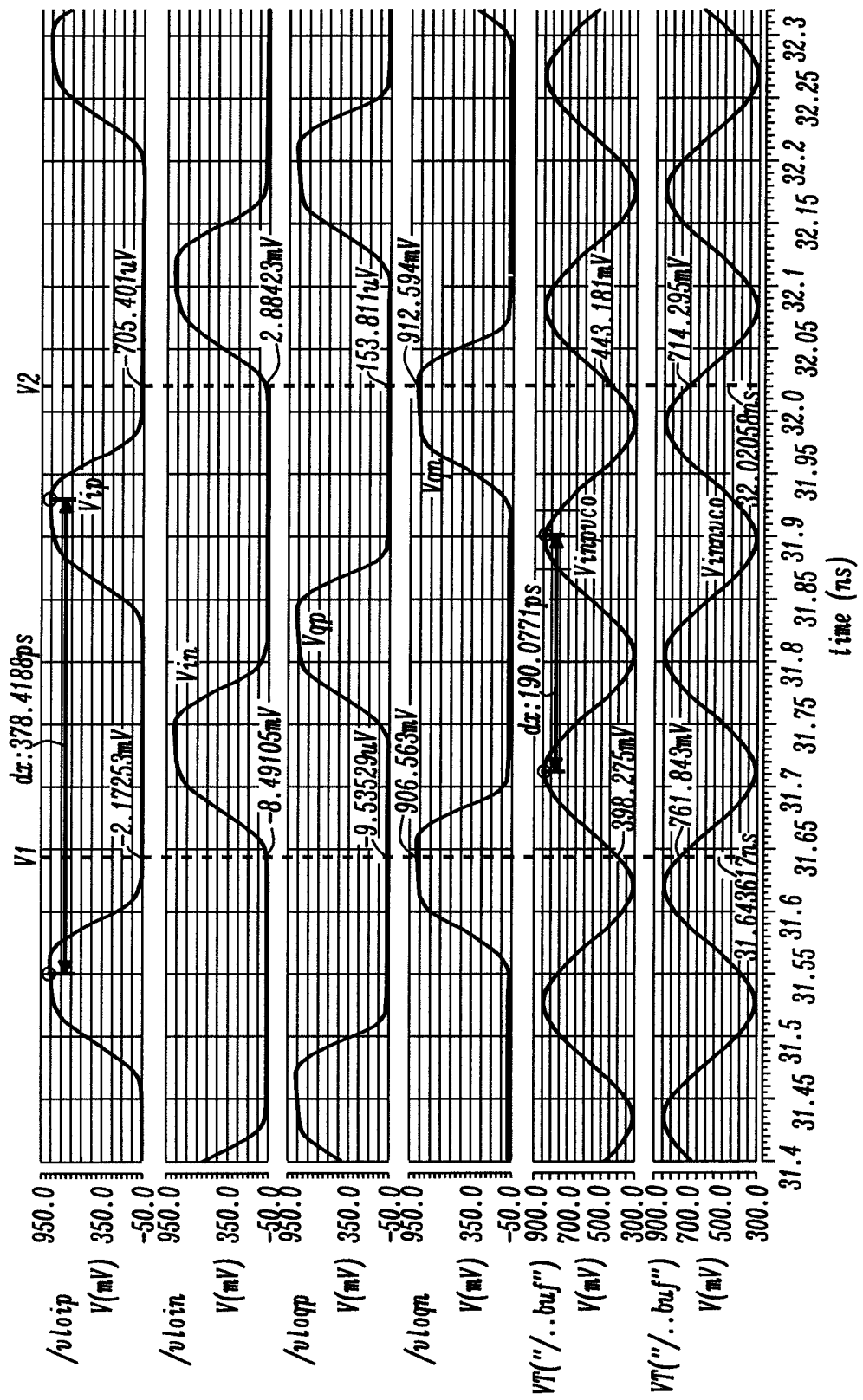
FIG. 8 shows timing diagrams illustrating operation of the frequency divider of FIG. 7 to provide a 25% duty-cycle LO signal output.

A timing diagram with input (2$f_0$=5.4 GHz) and output ($f_0$) signals of 25% duty-cycle LO signal is shown in FIG. 8 where 4-phases 25% duty-cycle quadrature (0°, 180° & 90°, 270°) LO signals ($f_0$=2.7 GHz) are generated from 2-phases (0° & 180°) double-frequency (2$f_0$=5.4 GHz) VCO input signals.

Figure 9:
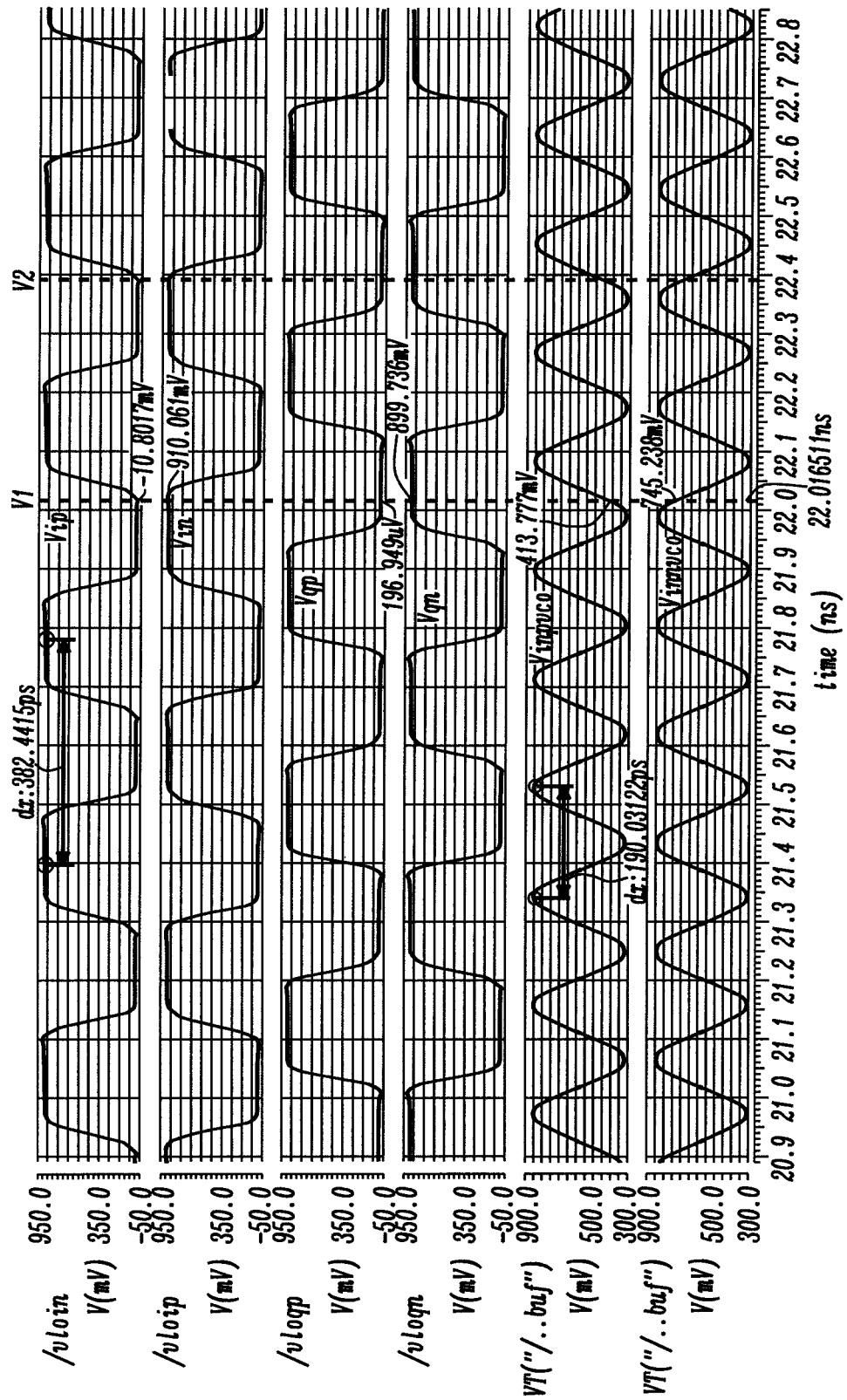
FIG. 9 shows timing diagrams illustrating operation of the frequency divider of FIG. 7 to provide a 50% duty-cycle LO signal output.
Figure 10:
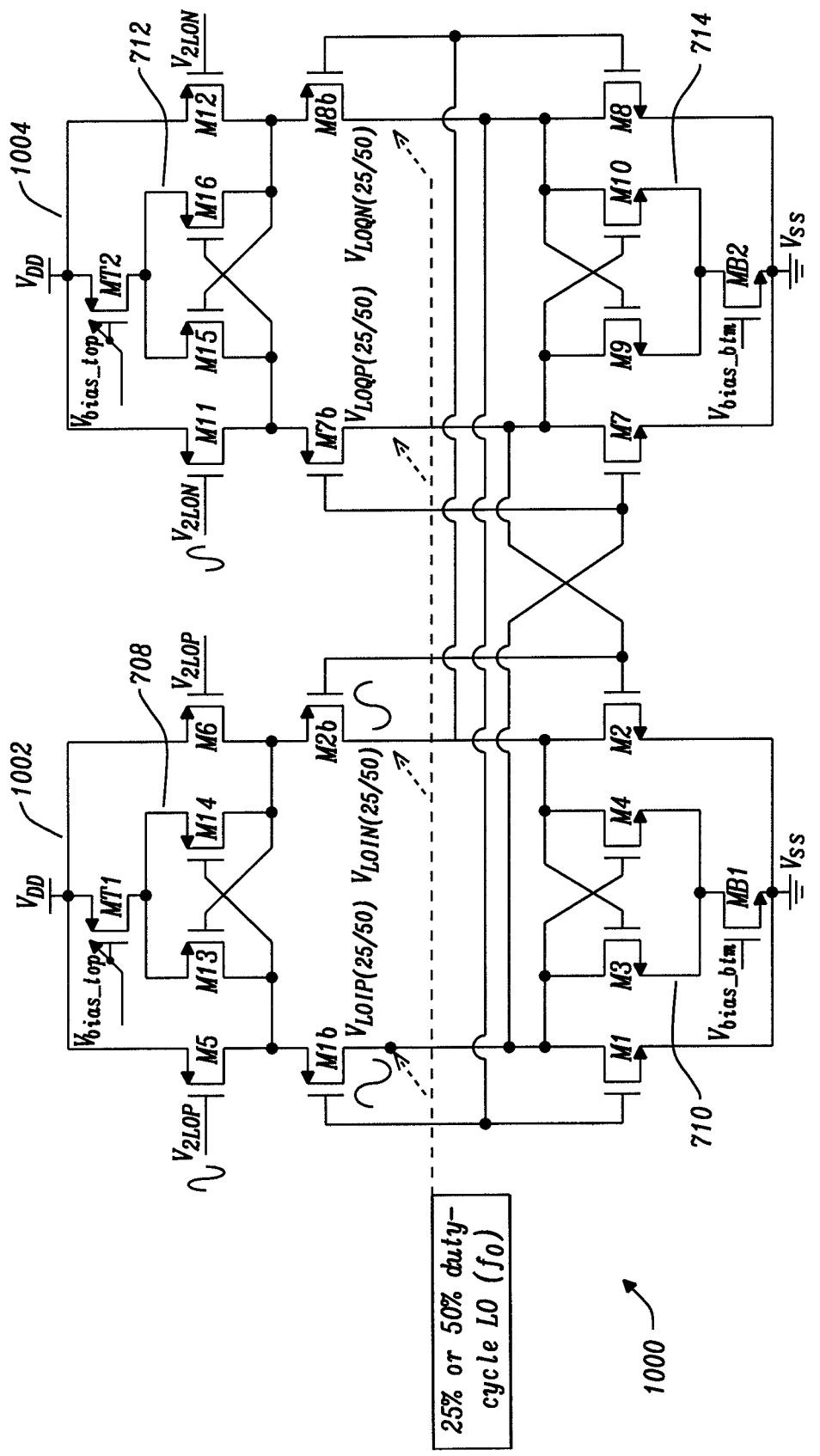
FIG. 10 shows details of a frequency divider according to yet another embodiment of the disclosure.

The gates of input PMOS devices (M5, M6 & M11, M12) are DC biased and 5.4 GHz with adequate amplitude (>200 mV peak-to-peak) sinusoidal VCO signals are applied to these gates through coupling capacitors (not shown) in FIG. 7. Note gate bias voltages can be biased with digitally-controlled variable voltages to vary the resonance frequency of the divider. By turning ON top current sources, Isource (comprising M21 & MT2), the source-regenerative cells 708, 712 become active and the divider 700 is turned into a 50% duty-cycle divider. The divider generates 50% duty-cycle divided-frequency ($f_0$) LO signals ($f_0$=2.7 GHz) as shown in the timing diagram of FIG. 9. FIG. 10 shows a frequency divider circuit 1000 according to a further embodiment of the disclosure, being a modification of the circuit of FIG. 7. Master and slave DFFs 1002, 1004 comprise the same source regenerative cells 708, 712 and sink regenerative cells 710, 714. However, this frequency divider circuit 1000 is provided with additional devices, here PMOS devices in one or both of the master 1002 or slave 1004 DFFs—see references M1b and M2b in the master DFF 1002 and references M7b and M8b in the slave DFF 1004.

The output signals from slave DFF 1004 are feedback to the inputs of the master DFF 1002 through a first inverter comprising M1 and M1b (or M2 and M2b). The additional PMOS devices (M1b, M2b, M7b and M8b) prevent short-circuit conditions in DFFs between supply and ground and also from output to ground/supply. Moreover, these devices also reduce glitches at divider outputs.

In another embodiment, being a further supplementary modification of the frequency divider circuit of FIG. 7, the programmability of bias of the current-sources ($I_{source}$ and $I_{sink}$) can allow for varying or adjusting the duty-cycle (25% or 50%) of divided LO signals around ±5%. This tuning of the duty cycle can be used to adjust duty-cycle variation over process and temperatures.

In summary, unlike prior-art dividers, the frequency divider circuit of this disclosure can generate different duty-cycle (for example, 25% or 50%) LO signals using a single frequency divider architecture.

The disclosure provides many advantages, including generating 50% duty-cycle LO signal for a transmitter or 25% or 50% LO signal for a receiver by controlling a regenerative cell in a latch of the divider. Further, the disclosure provides for variation of the duty cycle by programmable controlling of the regenerative cell through a current source. Additionally, these advantages allow for changing on-fly receiver functionality in a trade-off of sensitivity with linearity in a receiver.

For ultra-compact and low area design, a single-circuit divider according to the disclosure can be used because the signal paths between PA and mixer are relatively short.

Various improvements and modifications can be made to the above without departing from the scope of the disclosure.

What is claimed is:

1. A frequency divider circuit comprising one or more memory elements with a feedback loop and which are controllable to adjust a duty cycle of an output signal, wherein the or each memory element comprises a first regenerative cell and a second regenerative cell, and where one of said regenerative cells is a controllable regenerative cell which can be controlled to vary the duty cycle of an output of the frequency divider circuit.

2. The frequency divider circuit of claim 1, wherein said controllable regenerative cell can be selectively activated so that in a first configuration where the controllable regenerative cell is activated an output of the frequency divider circuit has a first duty cycle and in a second configuration where the controllable regenerative cell is deactivated an output of the frequency divider circuit has a second duty cycle.

3. The frequency divider circuit of claim 1, wherein the first regenerative cell is a source regenerative cell and the second regenerative cell is a sink regenerative cell.

4. The frequency divider circuit of claim 3, wherein the memory element comprises a variable current source coupled with said source regenerative cell and operable to control said source regenerative cell.

5. The frequency divider circuit of claim 1, comprising a variable current source which is operable to tune the duty cycle of an output signal.

6. The frequency divider circuit of claim 1, comprising an inverter between an output of a first slave memory element and an input of a master memory element.

7. The frequency divider circuit of claim 1, wherein the or each memory element comprises a D-type flip flop (DFF).

8. A transceiver comprising a frequency divider circuit comprising one or more memory elements with a feedback loop and which are controllable to adjust a duty cycle of an output signal, wherein the or each memory element comprises a first regenerative cell and a second regenerative cell, and where one of said regenerative cells is a controllable regenerative cell which can be controlled to vary the duty cycle of an output of the frequency divider circuit.

9. A mobile device comprising the transceiver of claim 8.

10. A frequency division method comprising providing one or more memory elements with a feedback loop and controlling said elements to adjust a duty cycle of an output signal, wherein the or each memory element comprises a first regenerative cell and a second regenerative cell, and where one of said regenerative cells is a controllable regenerative cell which can be controlled to vary the duty cycle of an output of the frequency divider circuit.

* * * * *